United States Patent [19]
Chiang

[11] Patent Number: 6,043,479
[45] Date of Patent: Mar. 28, 2000

[54] MOS ACTIVE PIXEL SENSOR UNIT WITH A SHUTTER

[75] Inventor: Ming-Cheng Chiang, Hsin Chu Hsien, Taiwan

[73] Assignee: Industrial Technology Research Institute, Hsinchu, Taiwan

[21] Appl. No.: 09/112,488

[22] Filed: Jul. 9, 1998

[30] Foreign Application Priority Data

May 14, 1998 [TW] Taiwan ................................. 87107493

[51] Int. Cl.⁷ .................................................. H01L 27/00
[52] U.S. Cl. ........................ 250/208.1; 348/308; 257/292
[58] Field of Search ............................. 250/208.1, 214.1, 250/214 R; 348/296, 297, 294, 307, 308; 257/239, 290, 291, 282

[56] References Cited

U.S. PATENT DOCUMENTS 5,471,515 11/1995 Fossum et al. ......................... 257/292

*Primary Examiner*—Edward P. Westin
*Assistant Examiner*—Kevin Pyo
*Attorney, Agent, or Firm*—Harness, Dickey & Pierce, P.L.C.

[57] ABSTRACT

A MOS active pixel sensor unit is disclosed which comprises: A first MOS transistor, a second MOS transistor, a third MOS transistor, and a fourth MOS transistor, wherein the third and fourth transistors are connected in series and both are provided between a variable voltage source and an output terminal, and the first and second transistors are connected in series and both are provided between the variable voltage source and the gate of the third transistor; and a photodiode connected with the second transistor in parallel, wherein the cathode of the photodiode is coupled to a node that connects the second and third transistors, and the anode of the photodiode is connected to a node that connects the first and second transistors. The variable voltage source switches its voltage level in association with the on/off control of the first and second transistors whereby the photodiode senses and transforms light intensity into a response signal and the response signal is outputted from the output terminal connected to the fourth transistor.

4 Claims, 4 Drawing Sheets

MOS ACTIVE PIXEL SENSOR UNIT WITH A SHUTTER

BACKGROUND OF THE INVENTION

1. Field of the Invention

The present invention relates in general to an image-sensing device. More specifically, it relates to a MOS active pixel sensor unit with a shutter (photodiode).

2. Description of the Related Art

Charge coupled devices are well-known image sensing devices utilized in various applications. In addition to charge coupled devices, active pixel sensors are also applied as image sensors. MOS active pixel sensors work by using photodiodes in association with NMOS transistors.

FIG. 1 illustrates a circuit structure of a conventional MOS active pixel sensor unit. Referring to FIG. 1, the structure of the MOS active pixel sensor unit will be described as follows. The drain of a NMOS transistor T1 is coupled to a constant voltage source VB, the source of the NMOS transistor T1 is coupled to the cathode of a photodiode Dp, and the anode of the photodiode Dp is grounded. The drain of a NMOS transistor T2 is coupled to the cathode of the photodiode Dp, and the source of the NMOS transistor T2 is coupled to the gate of a NMOS transistor T3. The drain of the NMOS transistor T3 is coupled to the constant voltage source VB, and the source of the NMOS transistor T3 is coupled to the drain of a NMOS transistor T4.

The MOS active pixel sensor unit depicted in FIG. 1 senses the light intensity of an image and transforms it into an electronic signal via the photodiode Dp, and the electronic signal is outputted at the terminal readout (the source of the NMOS transistor T4). The operation of the MOS active pixel sensor unit is described as follows, with reference to the timing chart depicted in FIG. 2.

In time interval (1), signals S1 and S2 with high voltages "1" are inputted to the gates of the transistors T1 and T2, respectively, thereby turning on transistors T1 and T2. The constant voltage source VB charges the node A.

In time interval (2), signal S1 is switched to low voltage "0" such that the transistor T1 is turned off. Meanwhile, the photodiode senses the light intensity of an image and generates a light-induced current passing from node A through transistor T2 and photodiode Dp to a grounding reference. Consequently, the voltage at node A is discharged to a voltage of $V_{A1}$. The duration of the time interval (2) is equivalent to the exposure time of the MOS active pixel sensor unit.

In time interval (3), both signals S1 and S2 are switched to low voltages "0" such that both transistors T1 and T2 are turned off, and thereby voltage $V_{A1}$ is held at node A. Meanwhile, the signal S4 is switched to a high voltage "1" such that the transistor T4 is turned on, thereby obtaining a light-response voltage V1 by reading $V_{A1}$ through transistors T3 and T4.

In time interval (4), both signals S2 and S4 are kept at high voltages "1", and the signal S1 is switched from a high voltage "1" to a low voltage "0". When the signal S1 is in a high voltage "1", the constant voltage source charges the node A. When the signal S1 is in a low voltage "0" (during the time interval exp), a light-reference voltage V2 is read from the transistor T4. Since the time interval exp is short, the exposure time of the MOS active pixel sensor unit is short enough such that the voltage drop at node A discharged by the light-induced current can be ignored. Consequently, the light-reference voltage V2, which is read during the time period exp, is equivalent to the voltage at the node A in the case of no light-induced current flowing through the photodiode Dp. The difference between the light-response voltage and the light-reference voltage is directly proportional to the light intensity.

FIG. 3 illustrates a circuit structure of an image-sensing device with resolution of 640×480 pixels, wherein the notation P represents a MOS active pixel sensor unit. 480 sensor units (P) share an output buffer and a load. All (640×480) active pixel sensor units of the image-sensing device sense images and store image data at the same time. Then, the data stored in the image-sensing device are read line by line (one line has 640 active pixel sensors).

The light-induced current generated by the photodiode Dp will change the voltage at node A into the voltage $V_{A1}$ in the exposure process during time interval (2). In time interval (3), the voltage $V_{A1}$ at node A is held by capacitors before it is read out. In FIG. 4, the parasitic capacitor Cs formed between the n-type diffusion drain of the transistor T2 and a p-type substrate, and the parasitic capacitor formed at the gate of the transistor T3, work together to store the voltage $V_{A1}$ at node A.

However, the total capacitance at node A usually is too small to store large charge. Therefore, the voltage at node A can not be kept for a long time and is discharged quickly. After storing image data in all sensor units, the image data are read line by line as described above. If the voltage at node A in each of the unit sensor units can not be held for a long time, the image data stored in some sensor units could vanish before they are read. Therefore, the ability to reliably access the data stored in the image-sensing device is degraded if the voltage $V_{A1}$ at node A can not be kept for a longer time.

Furthermore, the junction leakage in transistor T2 and the channel leakage due to the DIBL effect (Drain Induced Barrier Lowering effect) in transistor T2 will disturb and change the voltage $V_{A1}$ at node A. To overcome this issue, the channel length of the transistor T2 is increased, however, the performance of the transistor T2 will degrade due to the clock feed-through effect.

SUMMARY OF THE INVENTION

Therefore, an object of the present invention is to provide a novel MOS active pixel sensor unit with a shutter to overcome the problems mentioned above.

The present invention achieves the above-indicated objects by providing a MOS active pixel sensor unit with a shutter (photodiode) comprising: A first MOS transistor, a second MOS transistor, a third MOS transistor, and a fourth MOS transistor, wherein the third and fourth transistors are connected in series and both are provided between a variable voltage source and an output terminal, and the first and second transistors are connected in series and both are provided between the variable voltage source and the gate of the third transistor; and a photodiode connected with the second transistor in parallel, wherein the cathode of the photodiode is coupled to a node that connects the second and third transistors, and the anode of the photodiode is connected a node that connects the first and second transistors. The variable voltage source switches its voltage level in association with the on/off control of the first and second transistors, whereby the photodiode senses and transforms light intensity into a response signal and the response signal is outputted from the output terminal connected to the fourth transistor.

The operation of the sensor unit comprises the steps of: (a) Turning on the first and second transistors, and switching the voltage of the variable voltage source to a high voltage, the high voltage thereby charging the node at the cathode of the photodiode to an initial voltage; (b) turning on the first transistor and turning off the second transistor, and switching the voltage of the variable voltage source to a low voltage, the low voltage thereby charging the node at the anode of the photodiode to a reference voltage which is less than the initial voltage, wherein an induced current flows through the photodiode in response to the light intensity sensed by the photodiode such that the initial voltage is changed to a light-sensing voltage; (c) turning off the first transistor and turning on the second transistor to hold the light-sensing voltage; and (d) switching the voltage of the variable voltage source to the high voltage and turning on the fourth transistor, thereby outputting the light-sensing voltage from the output terminal connected to the fourth transistor.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

Figure 1:
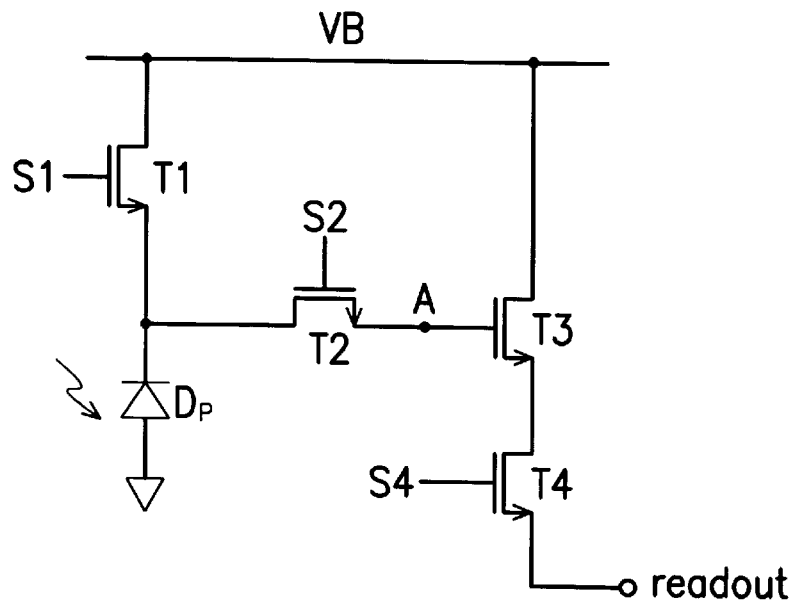
FIG. 1 illustrates a circuit structure of a conventional active pixel sensor.
Figure 2:
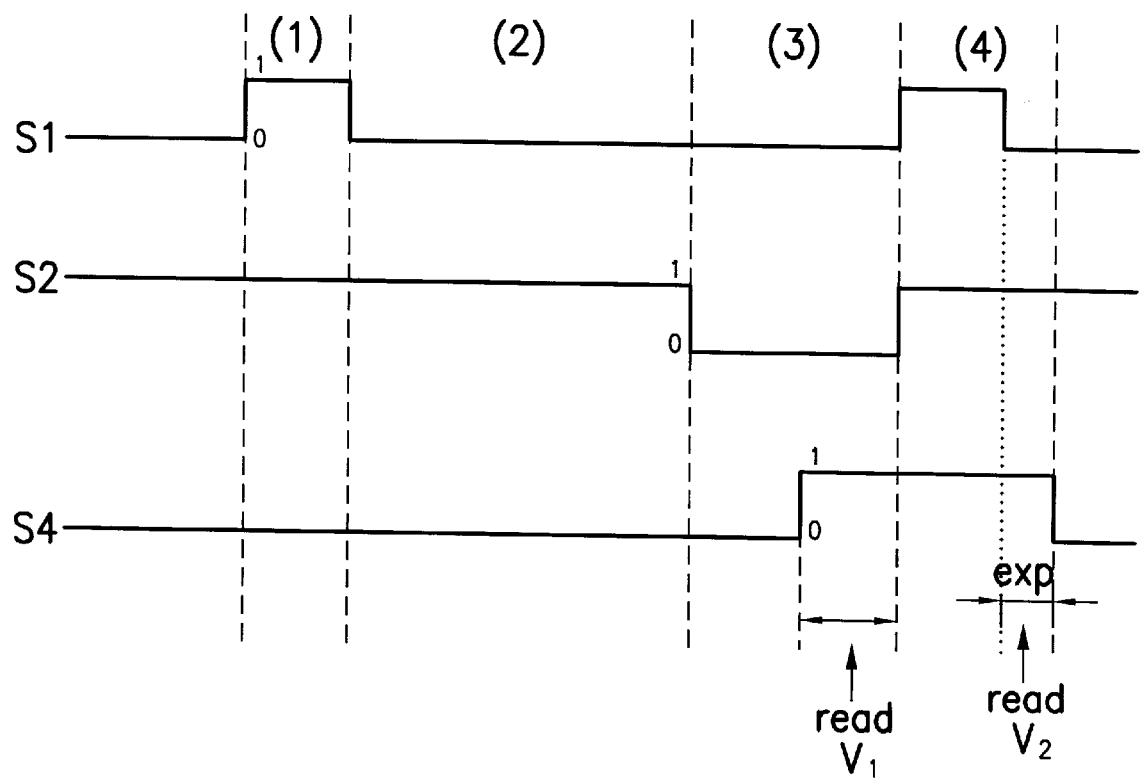
FIG. 2 illustrates the operation timing chart of the MOS active pixel sensor unit depicted in FIG. 1.
Figure 3:
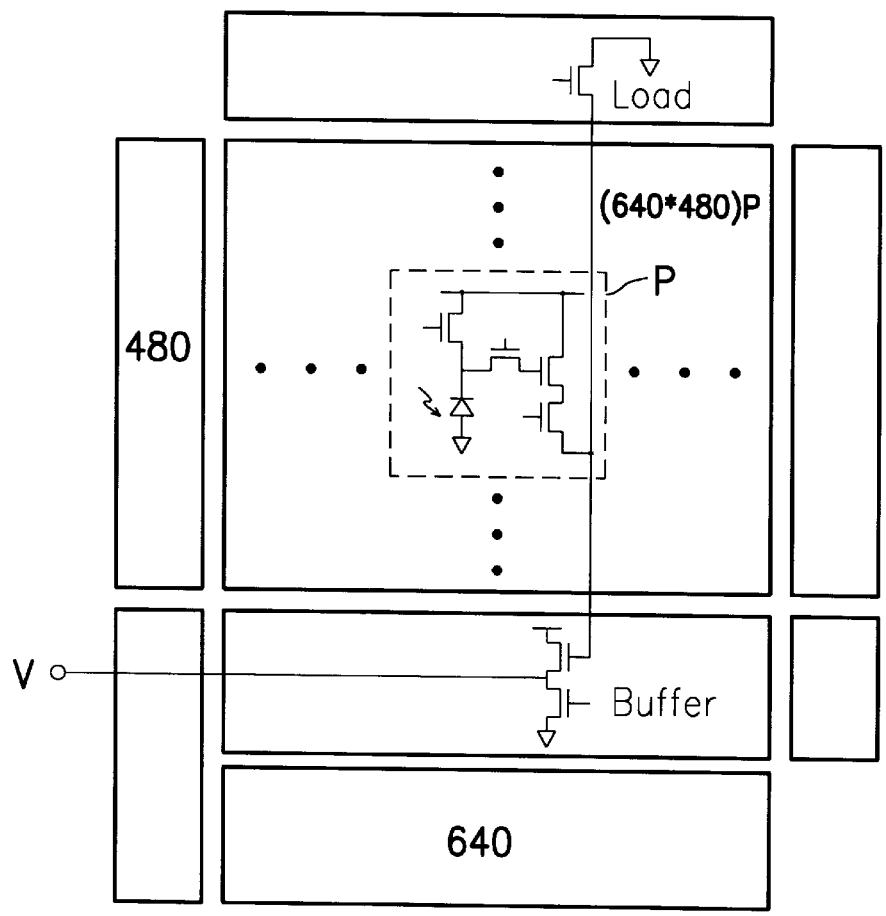
FIG. 3 illustrates the circuit structure of an image-sensing device with a resolution of 640×480 pixels.
Figure 5:
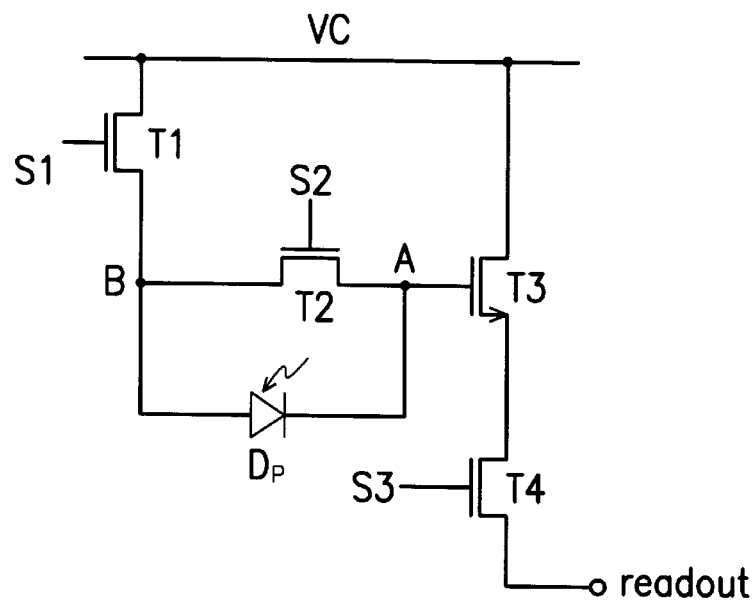
FIG. 5 illustrates a unit circuit of a MOS active pixel sensor unit according to the present invention.

FIG. 5 illustrates a unit circuit of a MOS active pixel sensor unit according to the present invention. For brevity, the devices and signals equivalent to those depicted in FIG. 1 are designated with the same notations and numerals.

In FIG. 5, a NMOS transistor T1 and a NMOS transistor T2 are connected in series, wherein the drain of the transistor T1 is coupled to a variable voltage source VC, and the source of the transistor T2 is coupled to the gate of a NMOS transistor T3. The transistor T3 and a NMOS transistor T4 are connected in series, and the drain of the transistor T3 is coupled to the constant voltage source VC. A photodiode Dp and the transistor T2 are connected in parallel, wherein the anode of the photodiode Dp is coupled to the connecting node of the transistors T2 and T1, and the cathode of the photodiode Dp is coupled to the source of the transistor T2. The variable voltage source VC switches its voltage level in association with the on/off control of the transistors T1 and T2, whereby the photodiode Dp senses and transforms light intensity into a response signal and the response signal is outputted from the output terminal (readout) connected to the transistor T4. The operation of the MOS active pixel sensor unit will be described in reference to the timing chart depicted in FIG. 6.

In time interval (I), the variable voltage source VC is 5 V (a high voltage), and both signals S1 and S2 are on high voltages "1" such that the transistors T1 and T2 are turned on. The variable voltage source (5 V) charges the cathode of the photodiode Dp (node A) to an initial voltage of Vini.

In time interval (II), the variable voltage source VC is switched to 3 V (a low voltage), the signal S1 is kept on a high voltage "1" and the signal S2 is switched to a low voltage "0", and therefore the transistor T1 is turned on and the transistor T2 is turned off. The variable voltage source (3 V) charges the anode of the photodiode Dp (node B) to a reference voltage of Vr. The photodiode is reversely biased, because the voltage Vr is less than the voltage Vini. Thus, no current flows through the photodiode Dp in forward direction (from the anode to the cathode of the photodiode Dp). However, the photodiode Dp senses the light intensity and generates a light-induced current flowing from the node A to node B during the time interval (II). Consequently, the initial voltage Vini at node A is changed due to discharge, thereby obtaining a light-sensing voltage $V_{LS}$ at node A.

In time interval (III), the signal S1 is switched to a low voltage "0" to turn off the transistor T1, and the signal S2 is switched to a high voltage "1" to turn on the transistor T2. The voltages at nodes A and B are the same, because the transistor T2 is turned on. In this state, the photodiode Dp can not generate a light-induced current flowing from the node A to node B. In this time interval, the light-sensing voltage $V_{LS}$ is held at the node A.

In time interval (IV), transistors T1 and T2 are kept in the same states as described in time interval (III), and the signal S4 is switched to a high voltage "1" such that the transistors T4 is turned on. The variable voltage source is 5 V and the light-sensing voltage $V_{LS}$ is outputted to the source of the transistor T4 (terminal readout) via the transistors T3. Therefore, an output voltage $V_{OLS}$ in response to light intensity is obtained at the readout terminal.

Figure 6:
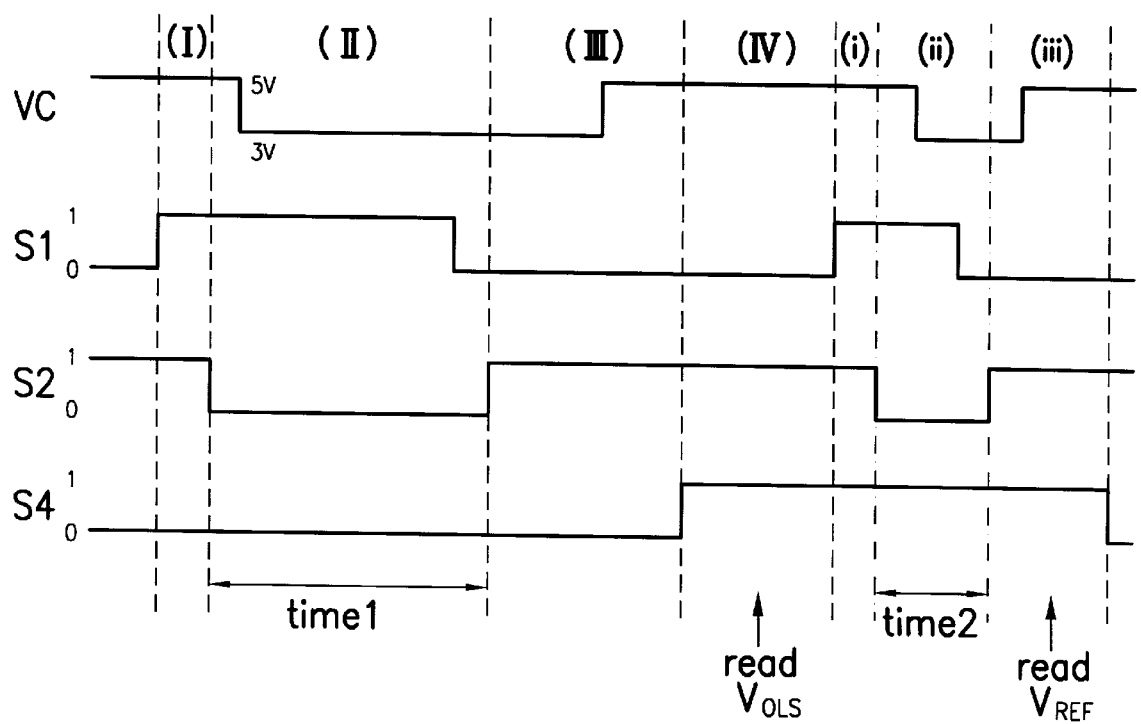
FIG. 6 illustrates the operation timing chart of the MOS active pixel sensor unit according to the present invention.

In FIG. 6, the operations during the time intervals (i), (ii), and (iii) are the same as those during the time intervals (I), (II), and (III), except that the signal S4 is switched to a high voltage "1" and the transistor T4 is turned on. Similarly, the initial voltage Vini is generated at node A in time interval (i). Though the photodiode Dp senses light intensity and generates light-induced current during the time interval (ii), the voltage drop of the initial voltage Vini at node A can be ignored. Because the exposure time (time2) in the time interval (ii) is less than the exposure time (time1) in the time interval (II), there is not sufficient time to discharge a large voltage drop from the initial voltage Vini. Consequently, the initial voltage Vini generated in the time interval (i) can serve as a reference voltage in the case that no light-induced current is flowing through the photodiode Dp. In the time interval (iii), the reference voltage is held at node A, and outputted to the source (terminal readout) of the transistor T4 through the transistor T3. Therefore, an output voltage $V_{REF}$ is read from the terminal readout.

Though the output voltage $V_{OLS}$ read in the time interval (IV) responds to light intensity, it is not directly proportional to light intensity. The actual light intensity (image signal) is directly proportional to the difference between the voltages $V_{OLS}$ and $V_{REF}$, because the difference actually responds the voltage drop caused by the light-induced current in proportion to the light intensity.

Figure 4:
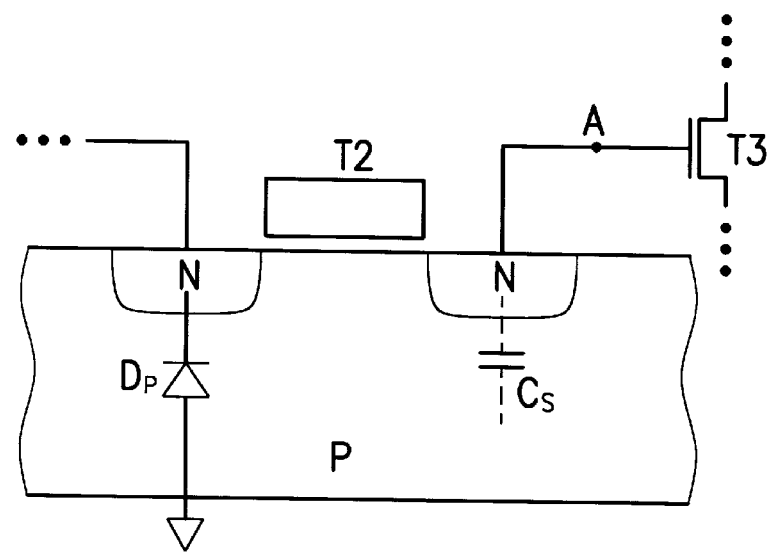
FIG. 4 illustrates a cross-sectional view of the transistor T2 depicted in FIG. 1.
Figure 7:
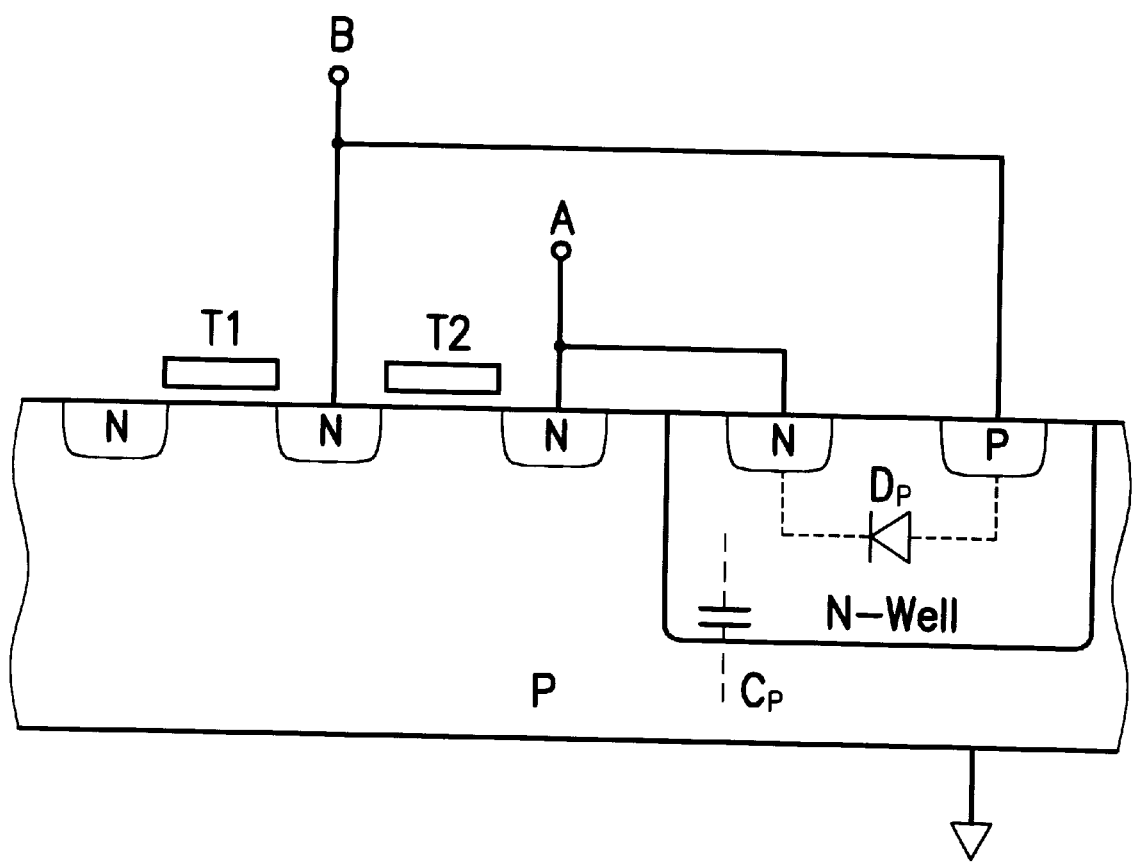
FIG. 7 illustrates a part of the devices depicted in FIG. 5, in cross sectional view.

In time interval (II), the photodiode Dp senses light and generates a light-induced current flowing from node A to node B, therefore, the initial voltage Vini at node A is discharged to the light-sensing voltage $V_{LS}$. In the time interval (III), the voltage $V_{LS}$ at the node A is held by capacitors before it is read out. In FIG. 7, the junction capacitor Cp formed between the n-well diffusion region and the p-type substrate, and the parasitic capacitor formed at the gate of the transistor T3, serve to store the voltage $V_{LS}$ at node A. The junction area between the n-well diffusion region and the p-type substrate in FIG. 7 is larger than that between the n-type diffusion drain and the p-type substrate in FIG. 4. The junction capacitor Cp is larger than capacitor Cs, and therefore the voltage $V_{LS}$ at node A can be stored for a longer time.

Moreover, in the present invention, the total capacitance at node A is large enough to store more charges, and therefore the junction leakage effect and the channel leakage due to DIBL effect will not disturb the voltage stored in node A, thereby overcoming the above problems without increasing the channel length of the transistor T2.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A MOS active pixel sensor unit comprising:
   a first MOS transistor, a second MOS transistor, a third MOS transistor, and a fourth MOS transistor, wherein said third and fourth transistors are connected in series and both are provided between a variable voltage source and an output terminal, and said first and second transistors are connected in series and both are provided between said variable voltage source and the gate of said third transistor; and
   a photodiode connected with said second transistor in parallel, wherein the cathode of said photodiode is coupled to a node that connects said second and third transistors, and the anode of said photodiode is connected to a node that connects said first and second transistors;
   wherein said variable voltage source switches its voltage level in association with the on/off control of said first and second transistors, whereby said photodiode senses and transforms light intensity into a response signal and said response signal is outputted from said output terminal connected to said fourth transistor.

2. The sensor unit as claimed in claim 1, wherein when said first and second transistors are turned on, and the voltage of said variable voltage source is switched to a high voltage, said high voltage charges the node at the cathode of said photodiode to an initial voltage;
   when said first transistor is turned on, said second transistor is turned off, and the voltage of said variable voltage source is switched to a low voltage, said low voltage charges the anode of said photodiode to a reference voltage which is less than said initial voltage, wherein an induced current flowing through said photodiode in response to the light intensity sensed by said photodiode such that said initial voltage is changed to a light-sensing voltage;
   when said first transistor is turned off and said second transistor is turned off, said light-sensing voltage is held at the cathode of said photodiode; and
   when the voltage of said variable voltage source is switched to said high voltage and said fourth transistor is turned on, said light-sensing voltage is outputted from said output terminal connected to said fourth transistor.

3. The sensor unit as claimed in claim 2, wherein after obtaining said light-sensing voltage, and keeping said fourth transistor turned-on,
   when said first and second transistor are turned on, the voltage of said variable voltage source is switched to said high voltage, said high voltage charges the node at the cathode of said photodiode to an first voltage;
   when said first transistor is turned on, said second transistor is turned off, and the voltage of said variable voltage source is switched to said low voltage, said low voltage charges the node at the anode of said photodiode to a second voltage which is less than said first voltage, wherein an induced current flowing through said photodiode in response to light intensity sensed by said photodiode such that said first voltage is changed to a third voltage; and
   when said first transistor is turned off and said second transistor is turned on, said third voltage is outputted from said output terminal of said fourth transistor as a basic voltage, wherein the difference between said light-sensing voltage and said third voltage correspond to the light intensity.

4. The sensor unit as claimed in claim 2, wherein said high voltage of said variable voltage source is 5 V, and said low voltage of said variable voltage source is 3 V.

* * * * *